(12) United States Patent
Ong et al.

(10) Patent No.: US 8,153,755 B2
(45) Date of Patent: *Apr. 10, 2012

(54) ELECTRONIC DEVICES

(75) Inventors: Beng S. Ong, Mississauga (CA); Hualong Pan, Hamilton (CA); Yuning Li, Mississauga (CA); Yiliang Wu, Mississauga (CA); Ping Liu, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/907,357

(22) Filed: Oct. 19, 2010

(65) Prior Publication Data

US 2011/0034668 A1   Feb. 10, 2011

Related U.S. Application Data

(63) Continuation of application No. 11/586,449, filed on Oct. 25, 2006, now Pat. No. 7,834,132.

(51) Int. Cl.
   C08G 75/00   (2006.01)
(52) U.S. Cl. ......... 528/380; 528/377; 528/373; 438/99
(58) Field of Classification Search ............ 528/373, 528/377, 380; 438/99
   See application file for complete search history.

(56) References Cited

U.S. PATENT DOCUMENTS

| | | | |
|---|---|---|---|
| 6,770,904 B2 | 8/2004 | Ong et al. | |
| 2002/0060321 A1* | 5/2002 | Kazlas et al. | 257/66 |
| 2005/0017311 A1 | 1/2005 | Ong et al. | |
| 2005/0082525 A1* | 4/2005 | Heeney et al. | 257/40 |
| 2006/0124921 A1 | 6/2006 | Ong et al. | |
| 2006/0214155 A1 | 9/2006 | Ong et al. | |

FOREIGN PATENT DOCUMENTS

CN       1807428       7/2006

OTHER PUBLICATIONS

See the "Cross Reference to Related Applications" on p. 1 of the Specification Being Filed Concurrently, Oct. 19, 2010.
Yuning Li et al., U.S. Appl. No. 11/398,981 on Functionalized Heteroacenes and Electronic Devices Generated Therefrom, filed Apr. 6, 2006.
Yuning Li et al., U.S. Appl. No. 11/399,226 on Functionalized Heteroacenes, filed Apr. 6, 2006.
Yuning Li et al., U.S. Appl. No. 11/399,216 on Polyacenes and Electronic Devices Generated Therefrom, filed Apr. 6, 2006.

(Continued)

Primary Examiner — Randy Gulakowski
Assistant Examiner — Shane Fang
(74) Attorney, Agent, or Firm — Fay Sharpe LLP

(57) ABSTRACT

An electronic device, such as a thin film transistor containing a semiconductor of the Formula:

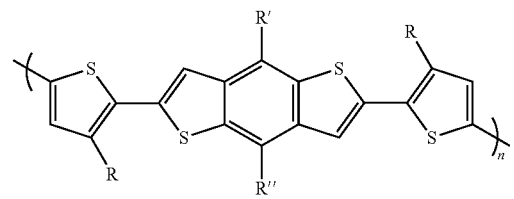

wherein R, R' and R" are, for example, independently hydrogen, a suitable hydrocarbon, a suitable hetero-containing group, a halogen, or mixtures thereof; and n represents the number of repeating units.

6 Claims, 2 Drawing Sheets

OTHER PUBLICATIONS

Yuning Li et al., U.S. Appl. No 11/399,064 on Heteroacene Polymers and Electronic Devices Generated Therefrom, filed Apr. 6, 2006.

Yuning Li et al., U.S. Appl. No. 11/399,169 on Ethynylene Acene Polymers and Electronic Devices Generated Therefrom, filed Apr. 6, 2006.

Yuning Li et al., U.S. Appl. No. 11/399,091 on Ethynylene Acene Polymers, filed Apr. 6, 2006.

Yuning Li et al., U.S. Appl. No. 11/399,231 on Poly[bis(ethynyl) heteroacenes] and Electronic Devices Generated Therefrom, filed Apr. 6, 2006.

Yiliang Wu et al., U.S. Appl. No. 11/399,141 on Semiconductors and Electronic Devices Generated Therefrom, filed Apr. 6, 2006.

Yiliang Wu et al., U.S. Appl. No. 11/399,230 on Semiconductor Polymers, filed Apr. 6, 2006.

Yiliang Wu et al., U.S. Appl. No. 11/398,941 on Polydiazaacenes and Electronic Devices Generated Therefrom, filed Apr. 6, 2006.

Yiliang Wu et al., U.S. Appl. No. 11/398,902 on Polydiazaacenes, filed Apr. 6, 2006.

Beng S. Ong et al., U.S. Appl. No. 11/398,931 on Poly (alkynylthiophene)s and Electronic Devices Generated Therefrom, filed Apr. 6, 2006.

Beng S. Ong et al., U.S. Appl. No. 11/398,246 on Poly (alkynylthiophene)s, filed Apr. 6, 2006.

Yuning Li et al., U.S. Appl. No. 11/399,092 on Linked Arylamine Polymers and Electronic Devices Generated Therefrom, filed Apr. 6, 2006.

Yuning Li et al., U.S. Appl. No. 11/399,065 on Linked Arylamine Polymers, filed Apr. 6, 2006.

Shiraishi et al., "New pi-conjugated polymers constituted of diakoxybenzodithiophene units: synthesis and electronic properties," Synthetic Metals, Elsevier Sequoia, Lausanne, CH; 2002; vol. 130, pp. 139-147.

Pan Hualong et al., "Synthesis and Thin-Film Transistor Performance of Poly(4,8-didodecylbenzo[1,2-b:4,5-b'] dithiphene," Chemistry of Materials, American Chemical Society, Washington, US; Jul. 11, 2006; vol. 18, No. 14, pp. 3237-3241.

Wang et al., "Linear C2-symmetric polycyclic benzodithiophene: efficient, highly diversified approaches and the optical properties," Tetrahedron Letters, Elsevier, Amsterdam, NL; Nov. 21, 2005; vol. 46, No. 47, pp. 8153-8157.

EP Search Report dated May 2, 2008.

* cited by examiner

ELECTRONIC DEVICES

This application is a continuation from U.S. patent application Ser. No. 11/586,449, filed Oct. 25, 2006. That application is hereby fully incorporated by reference in its entirety.

CROSS REFERENCE TO RELATED APPLICATIONS

U.S. application Ser. No. 11/586,448, filed Oct. 26, 2010, on Poly(dithienylbenzo[1,2-b:4,5-b']dithiophene) Polymers, by Beng S. Ong et al.

U.S. application Ser. No. 11/398,981, filed Apr. 6, 2006, on Functionalized Heteroacenes and Electronic Devices Generated Therefrom, by Yuning Li et al.

U.S. application Ser. No. 11/399,226, filed Apr. 6, 2006, on Functionalized Heteroacenes, by Yuning Li et al.

U.S. application Ser. No. 11/399,216, filed Apr. 6, 2006, on Polyacenes and Electronic Devices Generated Therefrom, by Yuning Li et al.

U.S. application Ser. No. 11/399,064, filed Apr. 6, 2006, on Heteroacene Polymers and Electronic Devices Generated Therefrom, by Yuning Li et al.

U.S. application Ser. No. 11/399,169, filed Apr. 6, 2006, on Ethynylene Acene Polymers and Electronic Devices Generated Therefrom, by Yuning Li et al.

U.S. application Ser. No. 11/399,091, filed Apr. 6, 2006, on Ethynylene Acene Polymers, by Yuning Li et al.

U.S. application Ser. No. 11/399,231, filed Apr. 6, 2006, on Poly[bis(ethynyl)heteroacenes] and Electronic Devices Generated Therefrom, by Yuning Li et al.

U.S. application Ser. No. 11/399,141, filed Apr. 6, 2006, on Semiconductors and Electronic Devices Generated Therefrom, by Yiliang Wu et al.

U.S. application Ser. No. 11/399,230, filed Apr. 6, 2006, on Semiconductor Polymers, by Yiliang Wu et al.

U.S. application Ser. No. 11/398,941, filed Apr. 6, 2006, on Polydiazaacenes and Electronic Devices Generated Therefrom, by Yiliang Wu et al.

U.S. application Ser. No. 11/398,902, filed Apr. 6, 2006, on Polydiazaacenes, by Yiliang Wu et al.

U.S. application Ser. No. 11/398,931, filed Apr. 6, 2006, on Poly(alkynylthiophene)s and Electronic Devices Generated Therefrom, by Beng S. Ong et al.

U.S. application Ser. No. 11/399,246, filed Apr. 6, 2006, on Poly(alkynylthiophene)s, by Beng S. Ong et al.

U.S. application Ser. No. 11/399,092, filed Apr. 6, 2006, on Linked Arylamine Polymers and Electronic Devices Generated Therefrom, by Yuning Li et al.

U.S. application Ser. No. 11/399,065, filed Apr. 6, 2006, on Linked Arylamine Polymers, by Yuning Li et al.

Illustrated in U.S. application Ser. No. 11/011,678, Publication No. 20060124921 filed Dec. 14, 2004, relating to indolocarbazole moieties and thin film transistor devices thereof.

Illustrated in U.S. application Ser. No. 11/167,512, Publication No. 20060214155 filed Jun. 27, 2005, relating to indolocarbazole moieties and thin film transistor devices thereof.

Illustrated in U.S. Pat. No. 6,770,904, and copending application U.S. application Ser. No. 10/922,662, Publication No. 20050017311, are electronic devices, such as thin film transistors containing semiconductor layers of, for example, polythiophenes.

The disclosure of each of the above cross referenced copending applications and patent are totally incorporated herein by reference. In aspects of the present disclosure, there may be selected the appropriate substituents, such as a suitable hydrocarbon, a heteroatom containing group, hydrogen, halogen, CN, $NO_2$, rings, source and gate electrodes, substrates, number of repeating polymer units, number of groups, and the like as illustrated in the copending applications.

BACKGROUND

The present disclosure is generally directed to semiconductors of the formulas as illustrated herein and processes of preparation and uses thereof. More specifically, the present disclosure in embodiments is directed to novel polymers of the formulas as illustrated herein, and more specifically, to poly(dithienylbenzo[1,2-b:4,5-b']dithiophene)s selected as semiconductors for polymer thin-film transistors and also which can be selected as solution processable and substantially stable channel semiconductors in organic electronic devices, such as thin film transistors and which transistors are stable in air, that is do not substantially degrade over a period of time when exposed to oxygen. Although not desiring to be limited by theory, it is believed that the presence of two thienylene functions in the semiconductor polymer assists in enhancing transistor performance, such as field effect mobility, for example there can be achieved TFT field effect mobility of $10^{-2}$ $cm^{-2}/v \cdot s$.

There are desired electronic devices and polymers thereof, such as thin film transistors, TFTs, fabricated with a semiconductor of the formulas as illustrated herein, and which semiconductors possess excellent solvent solubility, and which can be solution processable; and which devices possess mechanical durability and structural flexibility, characteristics which are desirable for fabricating flexible TFTs on a number of substrates, such as plastic substrates. Flexible TFTs enable the design of electronic devices with structural flexibility and mechanical durability characteristics. The use of plastic substrates together with the semiconductor of the formulas as illustrated herein can transform the traditionally rigid silicon TFT into a mechanically more durable and structurally flexible TFT design. This can be of particular value to large area devices such as large-area image sensors, electronic paper and other display media. Also, the selection of p-type semiconductors of the formulas as illustrated herein possess in embodiments extended conjugation for integrated circuit logic elements for low end microelectronics, such as smart cards, radio frequency identification (RFID) tags, and memory/storage devices, and enhance their mechanical durability, and thus their useful life span.

A number of semiconductor polymers are not, it is believed, stable when exposed to air as they become oxidatively doped by ambient oxygen resulting in increased conductivity. The result is large off-current and thus low current on/off ratio for the devices fabricated from these materials. Accordingly, with many of these polymers, rigorous precautions are usually undertaken during processing and device fabrication to exclude environmental oxygen to avoid or minimize oxidative doping. These precautionary measures increase the cost of manufacturing therefore offsetting the appeal of certain semiconductor TFTs as an economical alternative to amorphous silicon technology, particularly for large area devices. These and other disadvantages are avoided or minimized in embodiments of the present disclosure.

REFERENCES

Regioregular polyhexylthiophenes usually undergo rapid photo oxidative degradation under ambient conditions, while the know polytriarylamines possess some stability when exposed to air, however, these amines are believed to possess low field effect mobilities, disadvantages avoided or minimized with the polymers of the formulas as illustrated herein.

Also, acenes, such as pentacenes, heteroacenes, and their derivatives are known to possess acceptable high field effect mobility when used as channel semiconductors in TFTs. However, these materials can be rapidly oxidized by, for example, atmospheric oxygen under light, and such compounds are not considered as processable at ambient conditions. Furthermore, when selected for TFTs, non-substituted acenes are substantially insoluble, thus they are essentially nonsolution processable; accordingly, such compounds have been processed by vacuum deposition methods that result in high production costs, eliminated or minimized with the TFTs generated with the semiconductors illustrated herein. Although some substituted acenes are soluble in organic solvent, they usually have poor thin film formation characteristics, and thus not suitable for solution processing large area electronics.

A number of organic semiconductor materials has been described for use in field effect TFTs, which materials include organic small molecules, such as pentacene, see for example D. J. Gundlach et al., "Pentacene organic thin film transistors—molecular ordering and mobility", *IEEE Electron Device Lett.*, Vol. 18, p. 87 (1997); oligomers such as sexithiophenes or their variants, see for example reference F. Gamier et al., "Molecular engineering of organic semiconductors: Design of self-assembly properties in conjugated thiophene oligomers", *J. Amer. Chem. Soc.*, Vol. 115, p. 8716 (1993), and poly(3-alkylthiophene), see for example reference Z. Bao et al., "Soluble and processable regioregular poly(3-hexylthiophene) for field-effect thin film transistor application with high mobility", *Appl. Phys. Lett.* Vol. 69, p 4108 (1996). Although organic material based TFTs generally provide lower performance characteristics than their conventional silicon counterparts, such as silicon crystal or polysilicon TFTs, they are nonetheless sufficiently useful for applications in areas where high mobility is not required. These include large area devices, such as image sensors, active matrix liquid crystal displays, and low end microelectronics such as smart cards and RFID tags.

TFTs fabricated from p-type semiconductor polymers of the formulas illustrated herein may be functionally and structurally more desirable than conventional silicons and other semiconductors in that they may offer mechanical durability, structural flexibility, and the potential of being able to be incorporated directly onto the active media of the devices, thus enhancing device compactness for transportability. Also, a number of known small molecule or oligomer-based TFT devices rely on difficult vacuum deposition techniques for fabrication. Vacuum deposition is selected primarily because the materials selected are either insoluble or their solution processing by spin coating, solution casting, or stamp printing do not generally provide uniform thin films. Vacuum deposition may also involve the difficulty of achieving consistent thin film quality for large area format. Polymer TFTs, such as those fabricated from regioregular components of, for example, regioregular poly(3-alkylthiophene-2,5-diyl) by solution processes, while offering some mobility, suffer from their propensity towards oxidative doping in air. For practical low cost TFT design, it is therefore of value to have a semiconductor material that is both stable and solution processable, and where its performance is not adversely affected by ambient oxygen, for example, TFTs generated with poly(3-alkylthiophene-2,5-diyl) are sensitive to air. The TFTs fabricated from these materials in ambient conditions generally exhibit large off-current, very low current on/off ratios, and their performance characteristics degrade rapidly.

BRIEF DESCRIPTION OF THE DRAWINGS

Illustrated in FIGS. 1 to 4 are various representative embodiments of the present disclosure, and wherein p-type semiconductors of the formulas as illustrated herein are selected as the channel or semiconductor material in thin film transistor (TFT) configurations.

EMBODIMENTS

Figure 1:
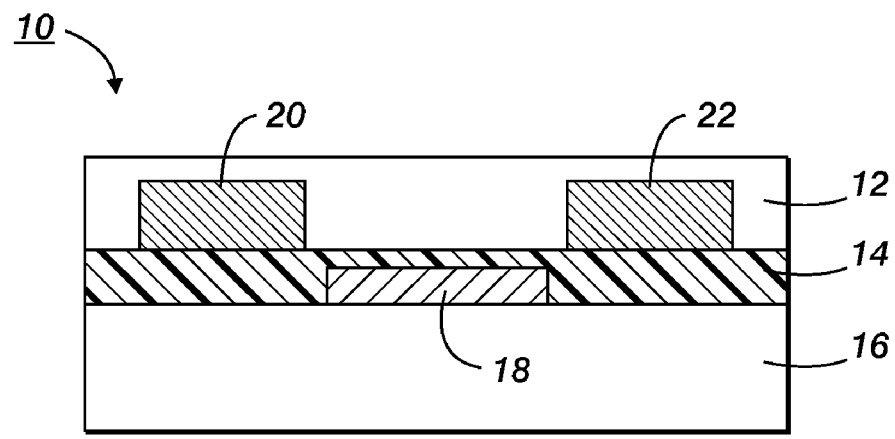

It is a feature of the present disclosure to provide semiconductors of the formulas/structures as illustrated herein which are useful for microelectronic device applications, such as TFT devices.

It is another feature of the present disclosure to provide p-type semiconductor polymers of the formulas/structures as illustrated herein with a band gap of from about 1.5 eV to about 3 eV as determined from the absorption spectra of thin films thereof.

In yet a further feature of the present disclosure there is provided p-type polymer semiconductors of the formulas/structures illustrated herein which are useful as microelectronic components, and which polymers possess a solubility of, for example, at least about 0.1 percent to about 95 percent by weight in common organic solvents, such as methylene chloride, tetrahydrofuran, toluene, xylene, mesitylene, chlorobenzene, dichlorobenzene, trichlorobenzene, and the like, and thus these polymers can be economically fabricated by solution processes such as spin coating, screen printing, stamp printing, dip coating, solution casting, jet printing, and the like.

Another feature of the present disclosure resides in providing electronic devices, such as TFTs, with p-type semiconductors of the formulas as illustrated herein, and more specifically, a poly(dithienylbenzo[1,2-b:4,5-b']dithiophene)s as semiconductors for polymer containing thin film transistors, and which semiconductor layer has a conductivity of, for example, from about $10^{-4}$ to about $10^{-9}$ S/cm (Siemens/centimeter).

Also, in yet another feature of the present disclosure there are provided novel p-type semiconductors of the formulas as illustrated herein, and devices thereof, and which devices exhibit enhanced resistance to the adverse effects of oxygen, that is, these devices exhibit relatively high current on/off ratios, and their performance does not substantially degrade as rapidly as similar devices fabricated with regioregular poly(3-alkylthiophene)s, or with acenes.

Additionally, in a further feature of the present disclosure there is provided a class of novel p-type semiconductors of the formulas as illustrated herein with unique structural features which are conducive to molecular self-alignment under appropriate processing conditions, and which structural features also enhance the stability of device performance. Proper molecular alignment can permit higher molecular structural order in thin film, which can be of value to efficient charge carrier transport, and thus higher electrical performance.

There are disclosed in embodiments a polymer, and more specifically, semiconductors of the formulas as illustrated herein, and electronic devices thereof. More specifically, the present disclosure relates to semiconductor polymers illustrated by or encompassed by Formulas/Structures (I)

(I)

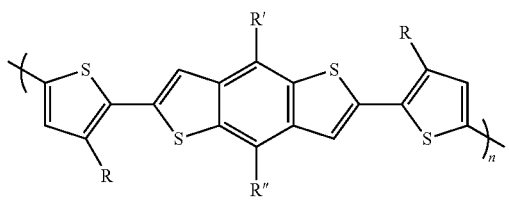

wherein R, R', and R" are independently at least one of hydrogen, a suitable hydrocarbon, a suitable hetero-containing group, and a halogen and where, for example, the hydrocarbon can be alkyl, alkoxy, aryl, substituted derivatives thereof, and the like, inclusive of side-chains containing, for example, from zero to about 30 carbon atoms, and more specifically, from 1 to about 18 carbon atoms; and n represents the number of repeating units such as a number of from about 2 to about 2,500, and more specifically, from about 2 to about 1,000, from about 100 to about 800, or from about 2 to about 50. In embodiments, R is a long carbon side-chain containing from about 6 to about 30 carbon atoms, and R' or R" is a substituent containing from 0 to about 5 carbon atoms; or R is a substituent containing from 0 to about 5 carbon atoms, and R' is a long carbon side-chain containing from 6 to about 30 carbon atoms. R, R', and R" are in embodiments, for example, independently hydrogen, a suitable hydrocarbon like alkyl, aryl, alkoxy, arylalkyl, alkyl substituted aryls, and the like; and mixtures thereof; and n represents the number of units, such as for example, n is a number of from about 2 to about 5,000, and more specifically, from about 2 to about 1,000, or from about 2 to about 700. In embodiments, R, R', and R" are, more specifically, alkyl, arylalkyl, and alkyl substituted aryls. Yet more specifically, R, R', and R" are alkyl with about 1 to about 35 carbon atoms of, for example, methyl, ethyl, propyl, butyl, pentyl, hexyl, heptyl, octyl, nonyl, decyl, undecyl, dodecyl, tridecyl, tetradecyl, pentadecyl, hexadecyl, heptadecyl or octadecyl; arylalkyl with about 7 to about 42 carbon atoms of, for example, methylphenyl(tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, and octadecylphenyl.

The number average molecular weight ($M_n$) of the polymers in embodiments can be, for example, from about 500 to about 400,000, including from about 1,000 to about 150,000, and the weight average molecular weight ($M_w$) thereof can be from about 600 to about 500,000, including from about 1,500 to about 200,000, both as measured by gel permeation chromatography using polystyrene standards.

In embodiments, specific p-type channel semiconductors are represented by structures (1) through (20).

(1)

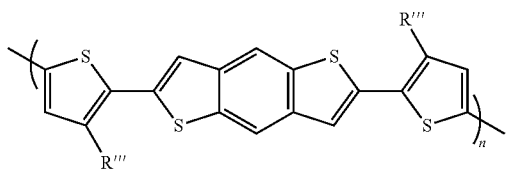

(2)

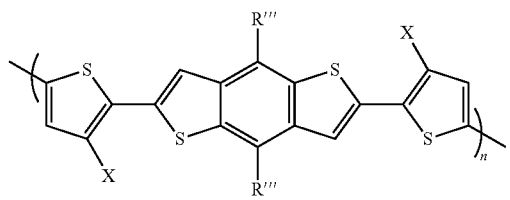

(3)

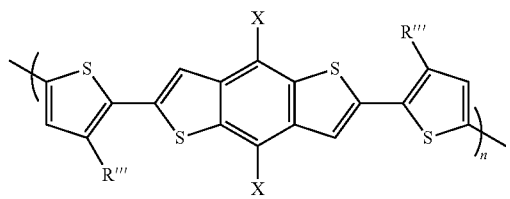

(4)

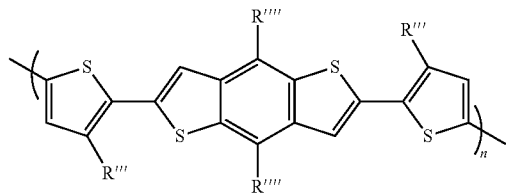

(5)

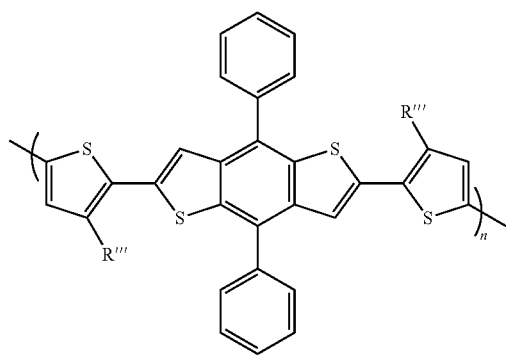

(6)

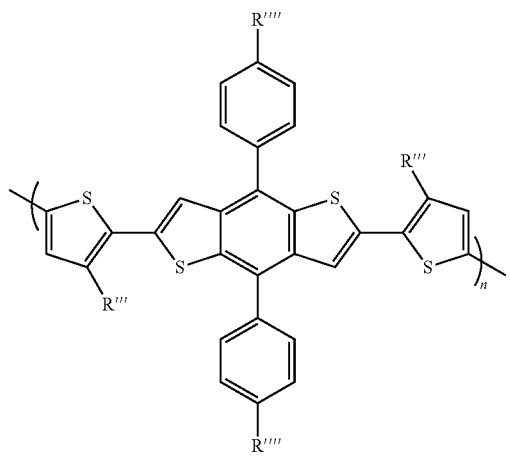

(7)
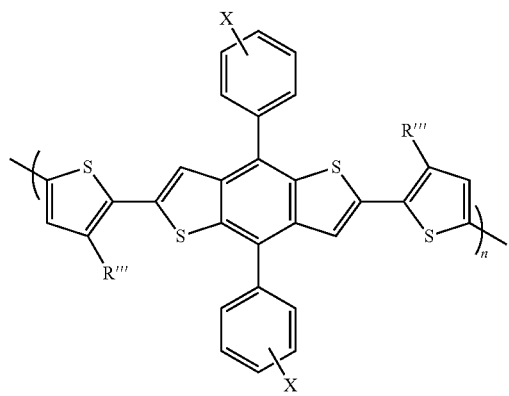
(8)
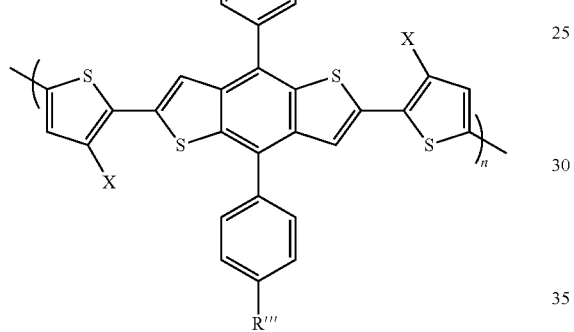
(9)
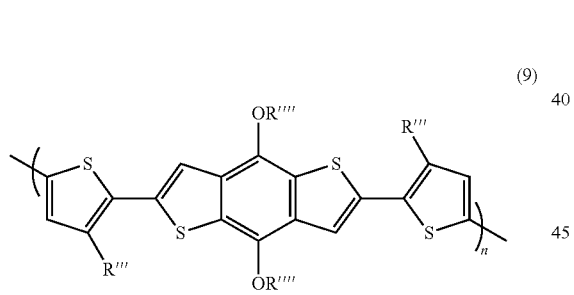
(10)
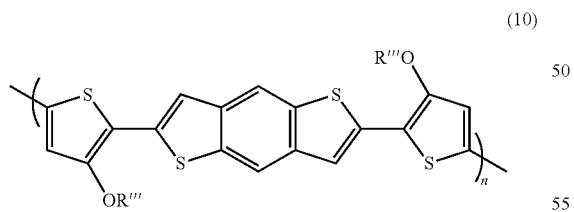
(11)
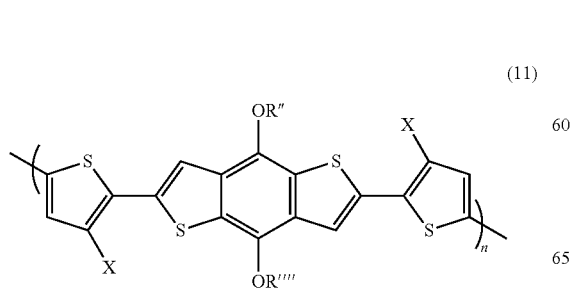
(12)
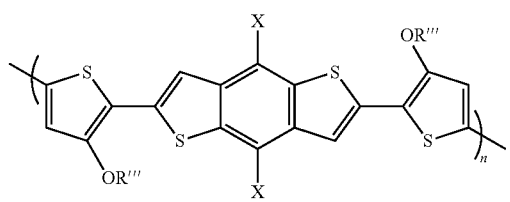
(13)
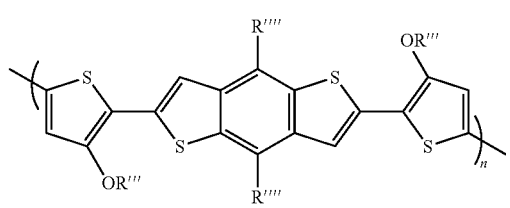
(14)
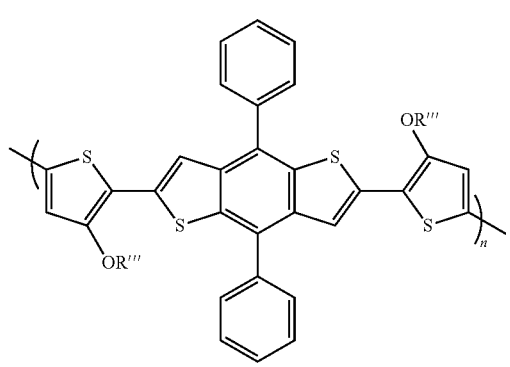
(15)
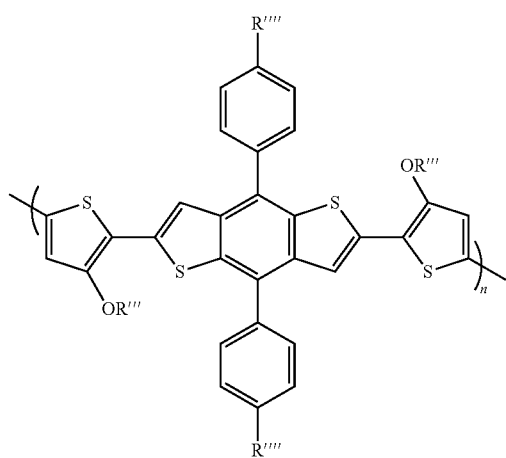

(16)
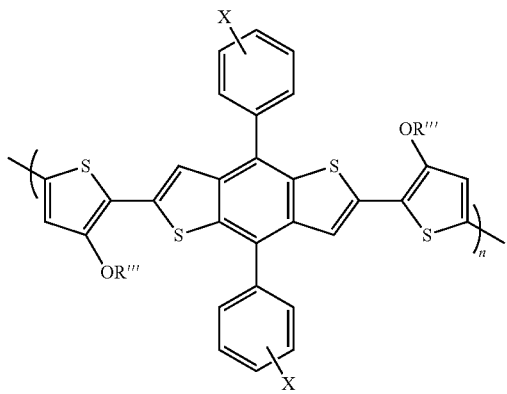

(17)
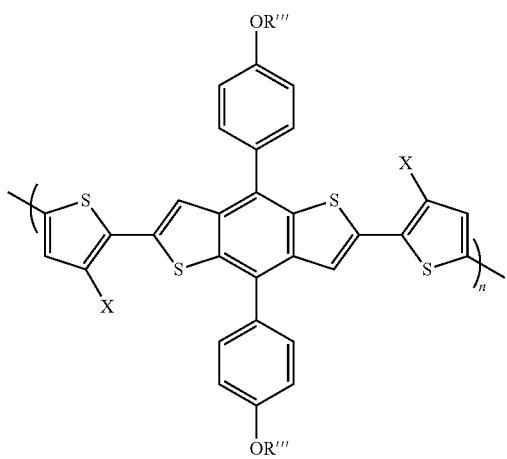

(18)
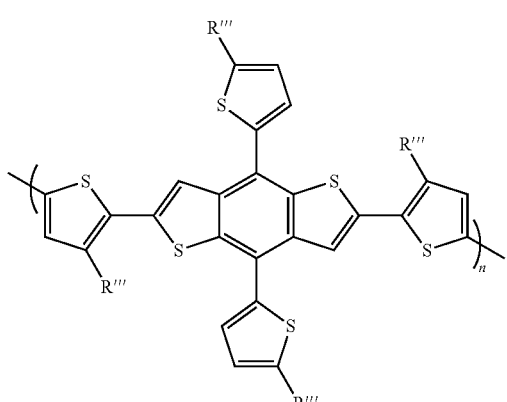

(19)
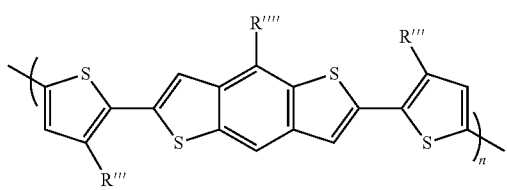

(20)
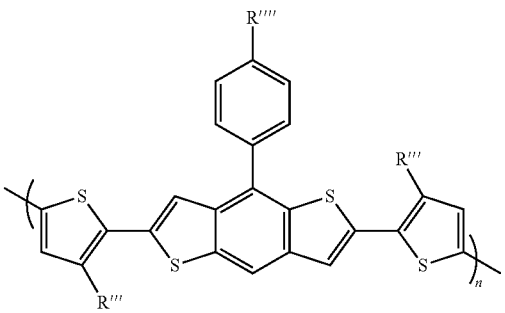

wherein each R''' and R'''' independently represents at least one of alkoxy, alkyl or substituted alkyl groups with, for example, from about 1 to about 35 carbon atoms of, for example, an alkyl or substituted alkyl of methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosanyl, hydroxymethyl, hydroxyethyl, hydroxypropyl, hydroxybutyl, hydroxypentyl, hydroxyhexyl, hydroxyheptyl, hydroxyoctyl, hydroxynonyl, hydroxydecyl, hydroxyundecyl, hydroxydodecyl, methoxyethyl, methoxypropyl, methoxybutyl, methoxypentyl, methoxyoctyl, trifluoromethyl, perfluoroethyl, perfluoropropyl, perfluorobutyl, perfluoropentyl, perfluorohexyl, perfluoroheptyl, perfluorooctyl, perfluorononyl, perfluorodecyl, perfluoroundecyl, or perfluorododecyl; X represents F, Cl, Br, CN, or $NO_2$; n represents the number of repeating units of the polymer, and can be, for example, from 2 to about 5,000, from about 5 to about 2,500, from about 5 to about 1,000, from about 5 to about 800, or from about 5 to about 200; the number average molecular weight ($M_n$) of the polymers can be, for example, from about 500 to about 400,000, including from about 1,000 to about 150,000, and the weight average molecular weight ($M_w$) thereof can be from about 600 to about 500,000, including from about 1,500 to about 200,000, both as measured by gel permeation chromatography using polystyrene standards.

In embodiments, examples of p-type channel semiconductors are represented by the following structures (21) through (33).

(21)
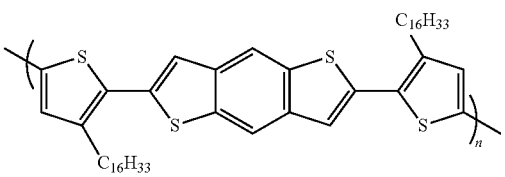

(22)
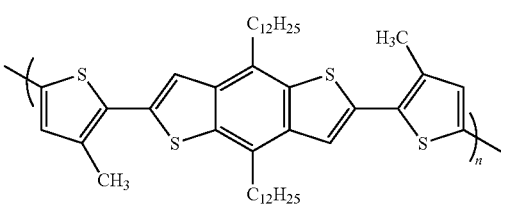

-continued

(23)
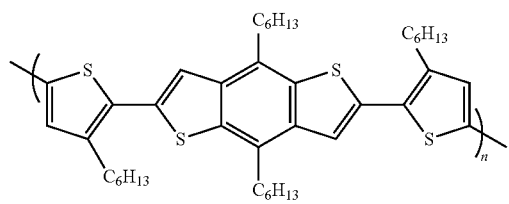

(24)
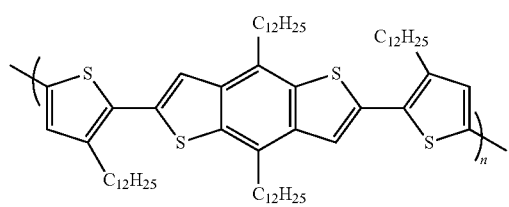

(25)
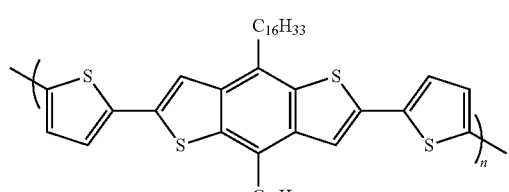

(26)
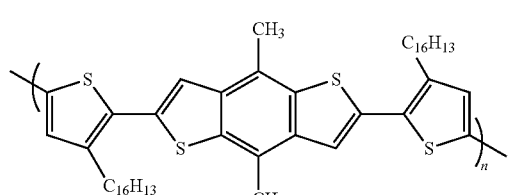

(27)
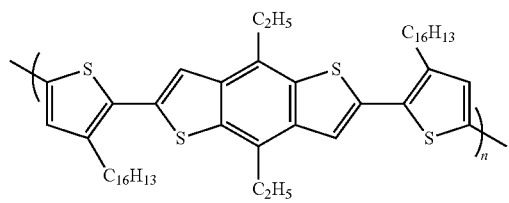

(28)
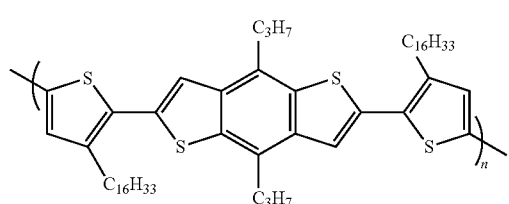

(29)
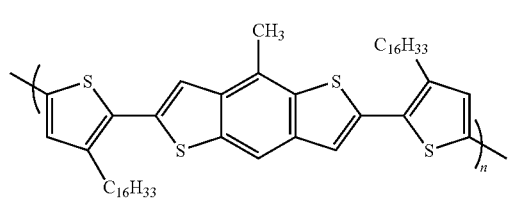

-continued

(30)
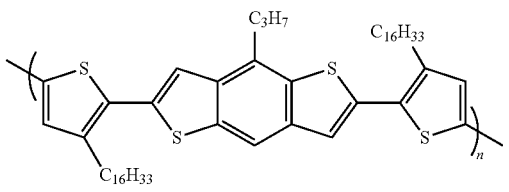

(31)
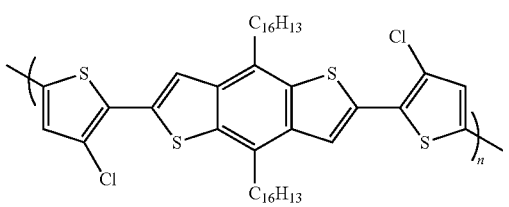

(32)
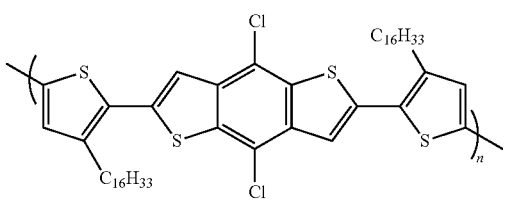

(33)
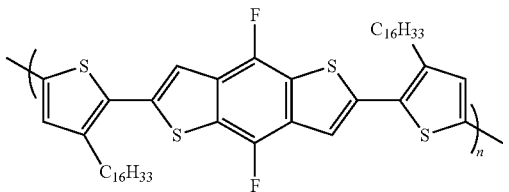

wherein n represents the number of repeating units of the polymer, and can be, for example, from 2 to about 5,000, from about 5 to about 2,500, and more specifically, from about 5 to about 1,000, from about 5 to about 800, or from about 5 to about 200. The number average molecular weight ($M_n$) of the polymers can be, for example, from about 500 to about 400,000, including from about 1,000 to about 150,000, and the weight average molecular weight ($M_w$) thereof can be from about 600 to about 500,000, including from about 1,500 to about 200,000, both as measured by gel permeation chromatography using polystyrene standards; or, more specifically, the p-type channel semiconductors are represented by the following structures

(21)
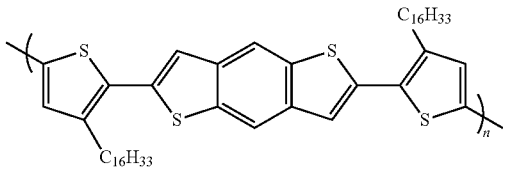

(22)

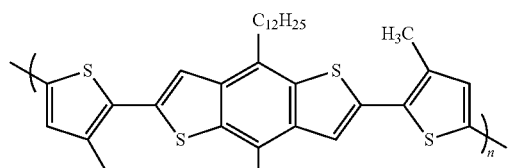

(23)

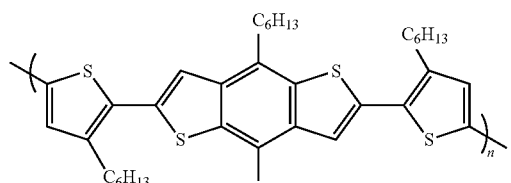

(24)

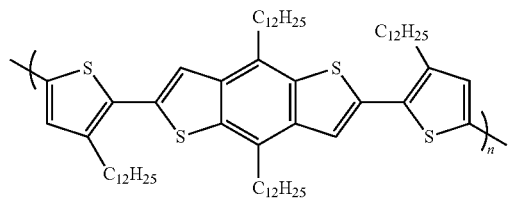

Scheme 1

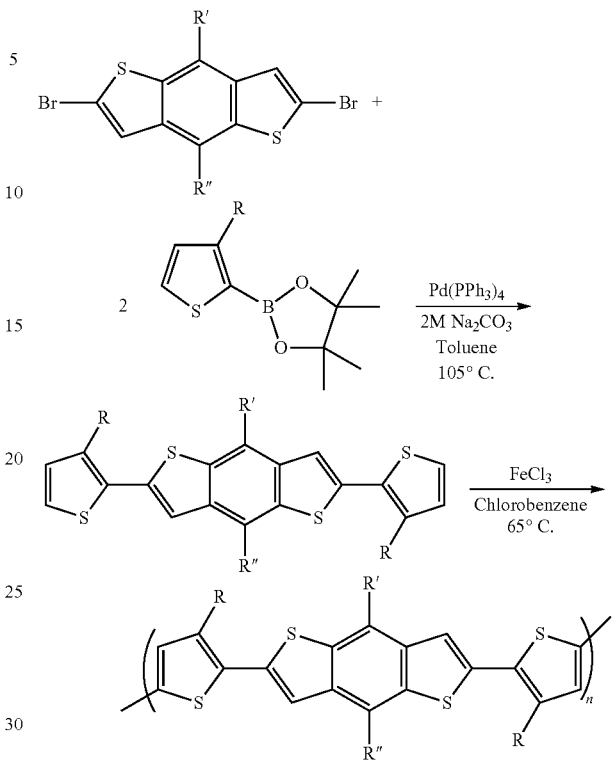

22 (R = Methyl; R' = R" = Dodecyl)
23 (R = R' = R" = hexyl)

wherein n represents the number of repeating units of the polymer, and can be, for example, from 2 to about 5,000, from about 5 to about 2,500, and more specifically, from about 5 to about 1,000, from about 5 to about 800, or from about 5 to about 200. The number average molecular weight ($M_n$) of the polymers can be, for example, from about 500 to about 400,000, including from about 1,000 to about 150,000, and the weight average molecular weight ($M_w$) thereof can be from about 600 to about 500,000, including from about 1,500 to about 200,000, both as measured by gel permeation chromatography using polystyrene standards.

In embodiments, there are disclosed processes for the preparation of the polymer type semiconductors of the formulas as illustrated herein in accordance, for example, with the following Scheme 1. More specifically, the process for the preparation of the polymer semiconductor of Formula (22), poly(4,8-didodecyl-2,6-bis-(3-methyl-thiophen-2-yl)-benzo[1,2-b;4,5-b']dithiophene), as illustrated herein, can be accomplished by, for example, i) reacting 2,6-dibromo-4,8-didodecylbenzo[1,2-b;4,5;b']dithiophene (prepared according to H. Pan, Y. Li, Y. Wu, P. Liu, B. S. Ong, S. Zhu, G. Xu, Chem. Mater., Vol. 18, p. 3237 (2006)) with 3-methylthiophene-2-boronic acid pinacol ester with a Suzuki coupling reaction in toluene in the presence of 2M aqueous $Na_2CO_3$ (sodium carbonate) solution, and catalytic amount of $Pd(PPh_3)_4$ (tetrakis(triphenylphosphine palladium(0)) at 105° C. to generate the monomer, 4,8-didodecyl-2,6-bis-(3-methyl-thiophen-2-yl)-benzo[1,2-b;4,5-b']dithiophene; ii) polymerizing 4,8-didodecyl-2,6-bis-(3-methyl-thiophen-2-yl)-benzo[1,2-b;4,5-b']dithiophene in chlorobenzene with $FeCl_3$ (iron(III)chloride)-mediated oxidative coupling reaction at about 65° C. for a suitable time, such as from about 35 to about 55, and more specifically 48 hours, to provide polymer (22) as a dark red solid. Polymer (23), where R=R'=R'=hexyl, was similarly synthesized.

The polymer semiconductors of Formulas/Structures (I) are soluble or substantially soluble in common coating solvents, for example, in embodiments they possess a solubility of at least about 0.1 percent by weight, and more specifically, from about 0.5 percent to about 10 percent, or to about 95 percent by weight in such solvents as methylene chloride, 1,2-dichloroethane, tetrahydrofuran, toluene, xylene, mesitylene, chlorobenzene, dichlorobenzene, and the like. Moreover, p-type semiconductors of the formulas as illustrated herein provide a stable conductivity of, for example, from about $10^{-9}$ S/cm to about $10^{-4}$ S/cm, and more specifically, from about $10^{-8}$ S/cm to about $10^{-5}$ S/cm as determined by conventional four-probe conductivity measurements.

It is believed that the p-type semiconductors disclosed when fabricated from solutions as thin films of, for example, from about 10 nanometers to about 500 nanometers, or from about 50 to about 300 nanometers in thickness are more stable in ambient conditions than similar devices fabricated from poly(3-alkylthiophene-2,5-diyl). When unprotected, the aforementioned p-type semiconductors of the formulas as illustrated herein, and devices thereof are generally stable for a number of weeks rather than days or hours as is the situation with poly(3-alkylthiophene-2,5-diyl) after exposure to ambient oxygen, thus the devices fabricated from p-type semiconductors of the formulas as illustrated herein can provide higher current on/off ratios, and their performance characteristics do not substantially change as rapidly as poly(3-alkylthiophene-2,5-diyl) when no rigorous procedural precautions have been taken to exclude ambient oxygen during material preparation, device fabrication, and evaluation. P-type semiconductors, such as the poly(dithienylbenzo[1,2- b:4,5-b']dithiophene)s disclosed herein, are in embodiments stable, that is they do not substantially degrade when exposed to oxygen.

In further aspects of the present disclosure, there is provided a thin film transistor comprised of a substrate, a gate electrode, a gate dielectric layer, a source electrode and a drain electrode, and in contact with the source/drain electrodes and the gate dielectric layer a semiconductor layer comprised of the polymers of Formula/Structure (I) such as a poly(dithienylbenzo[1,2-b:4,5-b']dithiophene); an electronic device comprising a semiconductive component and wherein the device is a thin film transistor, and the component is selected from the group consisting of at least one of a poly(dithienylbenzo[1,2-b:4,5-b']dithiophene) of the following Formulas/Structures (1) through (20).

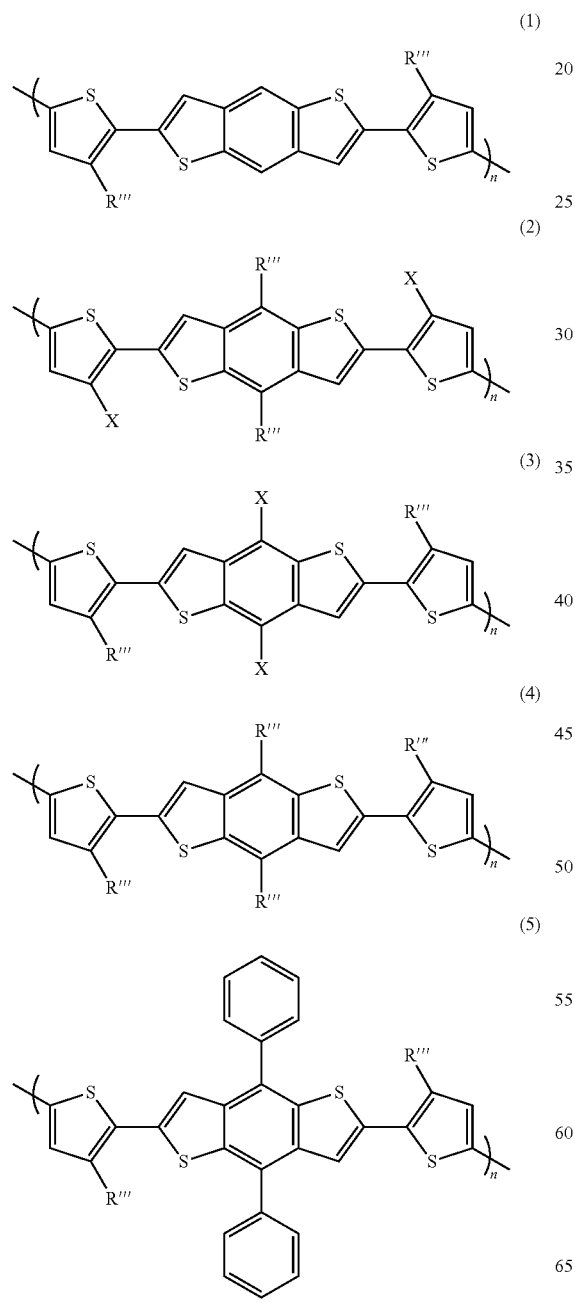

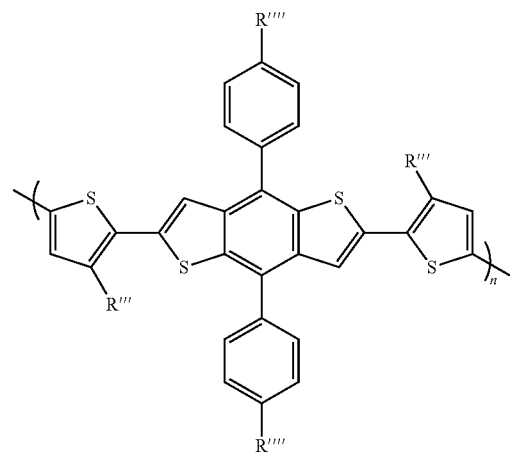

(10)
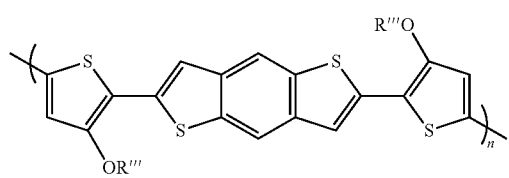
(11)
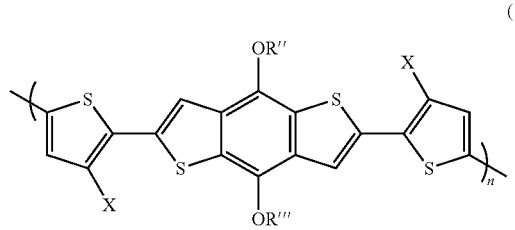
(12)
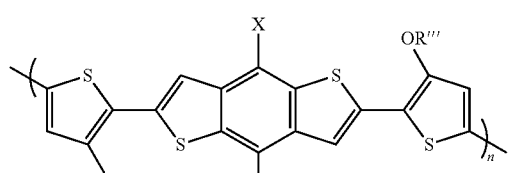
(13)
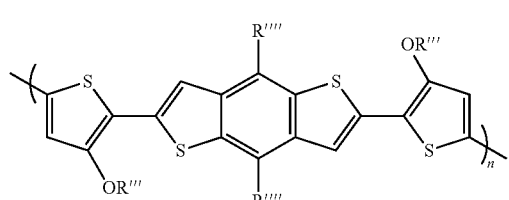
(14)
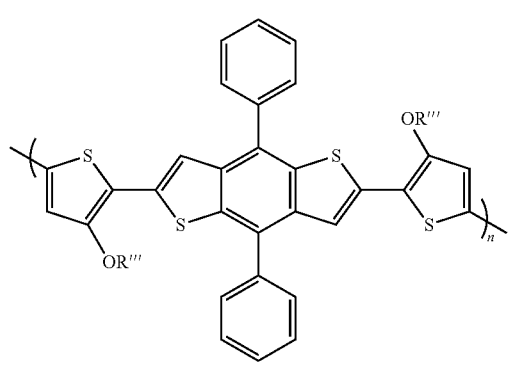
(15)
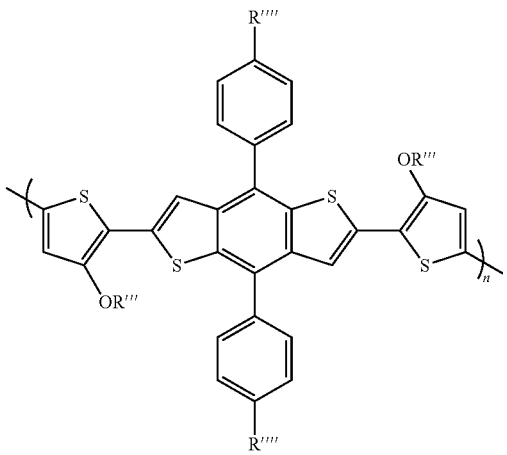
(16)
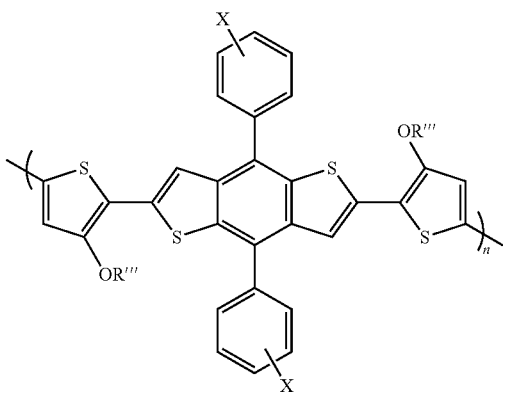
(17)
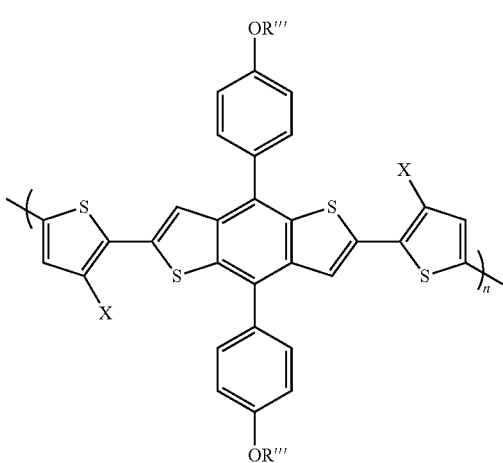

(18)

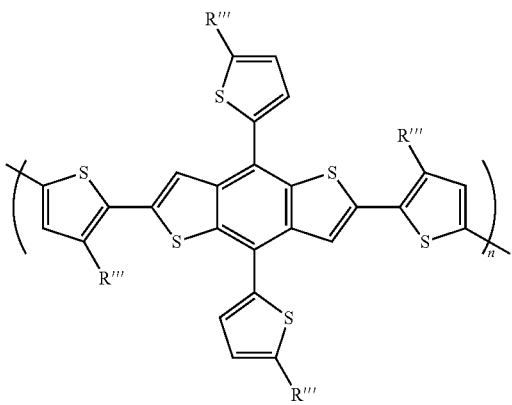

(19)

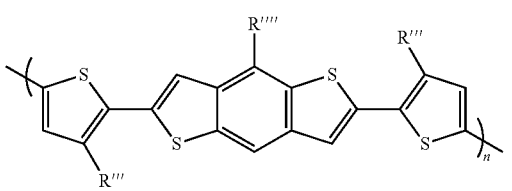

(20)

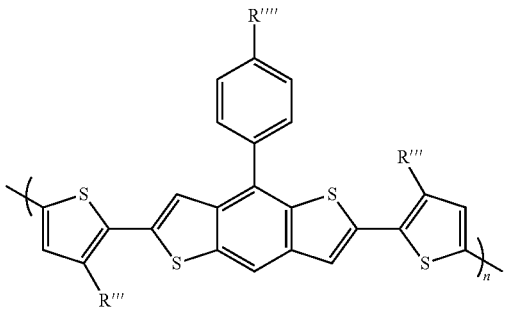

wherein each R''' and R'''' independently represents at least one of alkyl or substituted alkyl groups with from about 1 to about 35 carbon atoms of, for example, an alkyl or substituted alkyl of methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosanyl, hydroxymethyl, hydroxyethyl, hydroxypropyl, hydroxybutyl, hydroxypentyl, hydroxyhexyl, hydroxyheptyl, hydroxyoctyl, hydroxynonyl, hydroxydecyl, hydroxyundecyl, hydroxydodecyl, methoxyethyl, methoxypropyl, methoxybutyl, methoxypentyl, methoxyoctyl, trifluoromethyl, perfluoroethyl, perfluoropropyl, perfluorobutyl, perfluoropentyl, perfluorohexyl, perfluoroheptyl, perfluorooctyl, perfluorononyl, perfluorodecyl, perfluoroundecyl, or perfluorododecyl; X represents F, Cl, Br, CN, I or $NO_2$; n represents the number of repeating units of the polymer and can be, for example, from about 2 to about 5,000, from about 5 to about 2,500, from about 5 to about 1,000, from about 5 to about 800, or from about 5 to about 200; the number average molecular weight ($M_n$) of the polymers can be, for example, from about 500 to about 400,000, including from about 1,000 to about 150,000, and the weight average molecular weight ($M_w$) thereof can be from about 600 to about 500,000, including from about 1500 to about 200,000, both as measured by gel permeation chromatography using polystyrene standards; a TFT device wherein the substrate is a plastic sheet of a polyester, a polycarbonate, or a polyimide; the gate source and drain electrodes are each independently comprised of gold, nickel, aluminum, platinum, indium titanium oxide, or a conductive polymer, and the gate dielectric is a dielectric layer comprised of silicon nitride or silicon oxide; a TFT device wherein the substrate is glass or a plastic sheet; the gate, source and drain electrodes are each comprised of gold, and the gate dielectric layer is comprised of the organic polymer poly(methacrylate), or poly(vinyl phenol); a device wherein the semiconductor layer is formed by solution processes of spin coating, stamp printing, screen printing, or jet printing; a device wherein the gate, source and drain electrodes, the gate dielectric, and semiconductor layers are formed by solution processes of spin coating, solution casting, stamp printing, screen printing, or jet printing; and a TFT device wherein the substrate is a plastic sheet of a polyester, a polycarbonate, or a polyimide; and the gate, source and drain electrodes are fabricated from the organic conductive polymer polystyrene sulfonate-doped poly(3,4-ethylene dioxythiophene), or from a conductive ink/paste compound of a colloidal dispersion of silver in a polymer binder, and the gate dielectric layer is organic polymer or inorganic oxide particle-polymer composite; and poly(dithienylbenzo[1,2-b:4,5-b']dithiophene) polymers, and thin film transistors thereof.

DESCRIPTION OF THE FIGURES

In FIG. 1 there is schematically illustrated a TFT configuration 10 comprised of a substrate 16, in contact therewith a metal contact 18 (gate electrode), and a layer of an insulating dielectric layer 14 with the gate electrode having a portion thereof or the entire gate in contact with the dielectric layer 14 on top of which layer 14 two metal contacts, 20 and 22 (source and drain electrodes), are deposited. Over and situated between the metal contacts 20 and 22 is layer 12 comprised of the poly(dithienylbenzo[1,2-b:4,5-b']dithiophene) semiconductor, poly(4,8-didodecyl-2,6-bis-(3-methyl-thiophen-2-yl)-benzo[1,2-b;4,5-b']dithiophene), of Formula (22) wherein n is 23, or poly(4,8-dihexyl-2,6-bis-(3-hexyl-thiophen-2-yl)-benzo[1,2-b:4,5-b']dithiophene), of Formula (23), where n is 24. The gate electrode can be included in the substrate, in the dielectric layer, and the like throughout.

Figure 2:
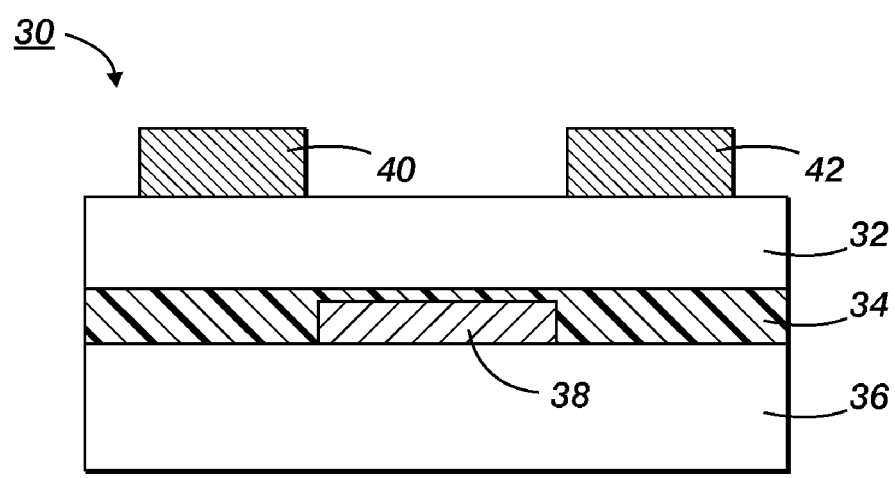

FIG. 2 schematically illustrates another TFT configuration 30 comprised of a substrate 36, a gate electrode 38, a source electrode 40, and a drain electrode 42, an insulating dielectric layer 34, and the semiconductor layer 32 of poly(4,8-didodecyl-2,6-bis-(3-methyl-thiophen-2-yl)-benzo[1,2-b;4,5-b']dithiophene) of Formula (22), or poly(4,8-dihexyl-2,6-bis-(3-hexyl-thiophen-2-yl)benzo[1,2-b:4,5-b]dithiophene) (23).

Figure 3:
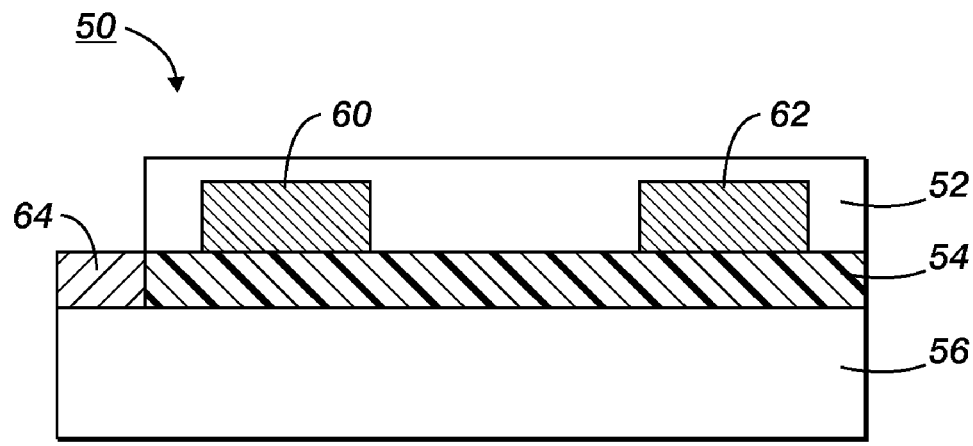

FIG. 3 schematically illustrates a further TFT configuration 50 comprised of a heavily n-doped silicon wafer 56, which can act as a gate electrode, a thermally grown silicon oxide dielectric layer 54, the poly(dithienylbenzo[1,2-b:4,5-b']dithiophene) semiconductor layer 52 of poly(4,8-didodecyl-2,6-bis-(3-methyl-thiophen-2-yl)-benzo[1,2-b;4,5-b'] dithiophene) (22), or poly(4,8-dihexyl-2,6-bis-(3-hexyl-thiophen-2-yl)-benzo[1,2-b:4,5-b']dithiophene) (23), and a source electrode 60, a drain electrode 62; and a gate electrode contact 64.

Figure 4:
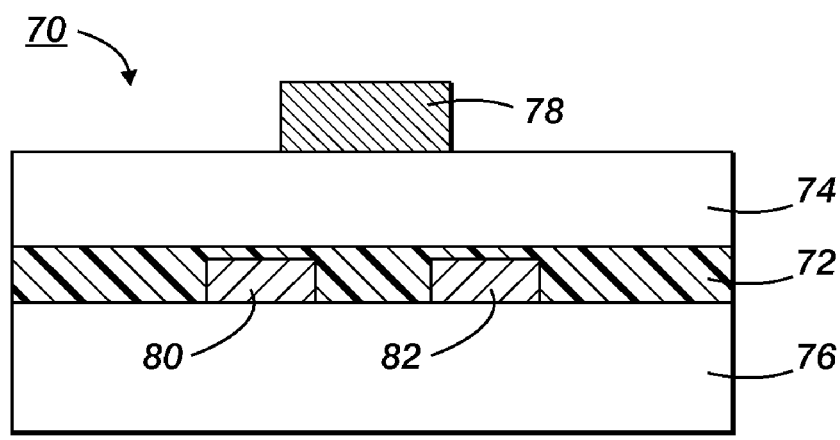

FIG. 4 schematically illustrates a TFT configuration 70 comprised of substrate 76, a gate electrode 78, a source electrode 80, a drain electrode 82, p-type semiconductors of the formulas as illustrated herein semiconductor layer 72 of poly(4,8-didodecyl-2,6-bis-(3-methyl-thiophen-2-yl)-benzo[1,2-b;4,5-b']dithiophene) of Formula (22), wherein n is 23, or poly(4,8-dihexyl-2,6-bis-(3-hexyl-thiophen-2-yl)-benzo[1,2-b:4,5-b]dithiophene) (23), wherein n is 24, and an insulating dielectric layer 74.

Also, other devices not disclosed, especially TFT devices, are envisioned, reference for example known TFT devices.

In some embodiments of the present disclosure, an optional protecting layer may be incorporated on top of each of the transistor configurations of FIGS. 1, 2, 3 and 4. For the TFT configuration of FIG. 4, the insulating dielectric layer 74 may also function as a protecting layer.

In embodiments and with further reference to the present disclosure and the Figures, the substrate layer may generally be a silicon material inclusive of various appropriate forms of silicon, a glass plate, a plastic film or a sheet, and the like depending on the intended applications. For structurally flexible devices, a plastic substrate, such as for example polyester, polycarbonate, polyimide sheets, and the like, may be selected. The thickness of the substrate may be, for example, from about 10 micrometers to over 10 millimeters with a specific thickness being from about 50 to about 100 micrometers, especially for a flexible plastic substrate, and from about 1 to about 10 millimeters for a rigid substrate such as glass or silicon.

The insulating dielectric layer, which can separate the gate electrode from the source and drain electrodes, and in contact with the semiconductor layer, can generally be an inorganic material film, an organic polymer film, or an organic-inorganic composite film. The thickness of the dielectric layer is, for example, from about 10 nanometers to about 1 micrometer with a more specific thickness being about 100 nanometers to about 500 nanometers. Illustrative examples of inorganic materials suitable as the dielectric layer include silicon oxide, silicon nitride, aluminum oxide, barium titanate, barium zirconate titanate, and the like; illustrative examples of organic polymers for the dielectric layer include polyesters, polycarbonates, poly(vinyl phenol), polyimides, polystyrene, poly(methacrylate)s, poly(acrylate)s, epoxy resin, and the like; and illustrative examples of inorganic-organic composite materials include nanosized metal oxide particles dispersed in polymers, such as polyester, polyimide, epoxy resin, and the like. The insulating dielectric layer is generally of a thickness of from about 50 nanometers to about 500 nanometers depending on the dielectric constant of the dielectric material used. More specifically, the dielectric material has a dielectric constant of, for example, at least about 3, thus a suitable dielectric thickness of about 300 nanometers can provide a desirable capacitance, for example, of about $10^{-9}$ to about $10^{-7}$ F/cm$^2$.

Situated, for example, between and in contact with the dielectric layer and the source/drain electrodes is the active semiconductor layer comprised of p-type semiconductors of the formulas as illustrated herein, and wherein the thickness of this layer is generally, for example, about 10 nanometers to about 1 micrometer, or about 40 to about 100 nanometers. This layer can generally be fabricated by solution processes such as spin coating, casting, screen, stamp, or jet printing of a solution of p-type semiconductors of the present disclosure.

The gate electrode can be a thin metal film, a conducting polymer film, a conducting film generated from a conducting ink or paste, or the substrate itself (for example heavily doped silicon). Examples of gate electrode materials include, but are not limited to aluminum, gold, chromium, indium tin oxide, conducting polymers, such as polystyrene sulfonate-doped poly(3,4-ethylenedioxythiophene) (PSS/PEDOT), a conducting ink/paste comprised of carbon black/graphite or colloidal silver dispersion contained in a polymer binder, such as Electrodag available from Acheson Colloids Company, and silver filled electrically conductive thermoplastic ink available from Noelle Industries, and the like. The gate layer can be prepared by vacuum evaporation, sputtering of metals or conductive metal oxides, coating from conducting polymer solutions or conducting inks, or dispersions by spin coating, casting or printing. The thickness of the gate electrode layer is, for example, from about 10 nanometers to about 10 micrometers, and a specific thickness is, for example, from about 10 to about 200 nanometers for metal films, and about 1 to about 10 micrometers for polymer conductors.

The source and drain electrode layer can be fabricated from materials which provide a low resistance ohmic contact to the semiconductor layer. Typical materials suitable for use as source and drain electrodes include those of the gate electrode materials such as gold, nickel, aluminum, platinum, conducting polymers, and conducting inks. Typical thickness of this layer is, for example, from about 40 nanometers to about 1 micrometer with the more specific thickness being about 100 to about 400 nanometers. The TFT devices contain a semiconductor channel with a width W and length L. The semiconductor channel width may be, for example, from about 10 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally, for example, about 0 volt to about −80 volts is applied to the drain electrode to collect the charge carriers transported across the semiconductor channel when a voltage of generally, for example, about +10 volts to about −80 volts is applied to the gate electrode.

Other known suitable materials not recited herein for the various components of the TFT devices of the present disclosure can also be selected in embodiments.

The following Examples are provided:

EXAMPLE I

1) Synthesis of poly(4,8-didodecyl-2,6-bis-(3-methyl-thiophen-2-yl)-benzo[1,2-b:4,5-b']dithiophene) (22) (Scheme 1)

a) 4,8-Didodecyl-2,6-bis-(3-methyl-thiophen-2-yl)-benzo[1,2-b:4,5-b']dithiophene To a 100 milliliter 3-necked reaction flask, 1 gram of 2,6-dibromo-4,8-didodeclybenzo[1,2-b:4,5;b']dithiophene (prepared according to H. Pan, Y. Li, Y. Wu, P. Liu, B. S. Ong, S. Zhu, G. Xu, *Chem. Mater.*, Vol. 18, p. 3237 (2006), the disclosure of which is totally incorporated herein by reference), 0.37 gram of 3-methylthiophene-2-boronic acid pinacol ester, and 25 milliliters of toluene were added. The resulting mixture was thoroughly stirred and was purged with argon. Then 0.04 gram of tetrakis(triphenylphosphine palladium(0)) (Pd(Ph$_3$P)$_4$), 0.3 gram of Aliquat in 5 milliliters toluene, and 3.5 milliliters of 2 M aqueous Na$_2$CO$_3$ were added to the mixture. The reaction mixture obtained was stirred at 105° C. for 26 hours. After cooling to room temperature, about 23° C. to about 26° C., there were added 100 milliliters of toluene, and the organic layer was washed with deionized water 3 times in a separatory funnel, dried over anhydrous MgSO$_4$, and filtered. After removing the solvent, the remaining solid was purified by column chromatography on silica gel (eluent: hexane/dichloromethane, 7/1, v/v) and recrystallized from 2-propanol to yield yellow needle-like crystals. Yield: 0.57 gram (57 percent). $^1$H NMR (CDCl$_3$, 300 MHz, ppm): δ 7.46 (s, 2H), 7.26 (d, J=5 Hz, 2H), 6.96 (d, J=5 Hz, 2H), 3.17 (t, 4H), 2.55 (s, 6H), 1.86 (m, 4H), 1.27 (br, 36H), 0.90 (t, 6H).

$^{13}$C NMR (CDCl$_3$, 300 MHz, ppm): δ 137.92, 136.77, 136.37, 135.49, 132.04, 128.86 (2C), 124.72, 120.26, 33.74, 32.31, 30.33, 30.08, 30.04, 29.97 (×2), 29.94, 29.91, 29.74, 23.08, 15.97, 14.55 b) Poly(4,8-didodecyl-2,6-bis-(3-methyl-thiophen-2-yl)-benzo[1,2-b:4,5-b']dithiophene) (22)

A solution of the above prepared 4,8-didodecyl-2,6-bis-(3-methyl-thiophen-2-yl)-benzo[1,2-b:4,5-b']dithiophene (0.412 gram) in 10 milliliters of chlorobenzene was added drop-wise through a dropping funnel to a well-stirred mixture of FeCl$_3$ (iron(III)chloride) (0.46 gram) in 10 milliliters of chlorobenzene in a 50 milliliter round-bottom flask under an argon atmosphere over a period of 1 minute. The resulting mixture was heated to 65° C. and maintained at this temperature for 48 hours under a blanket of argon. After cooling down to room temperature, 15 milliliters of chlorobenzene were added, and the solution was added to 200 milliliters of stirring methanol. The mixture was then ultrasonicated for 2 minutes before stirred at room temperature for 1 hour. The polymer was filtered out and added into a well stirred mixture of 200 milliliters of methanol, and 50 milliliters of ammonia aqueous solution (30 weight percent). The mixture was ultrasonicated for 30 minutes and then stirred at room temperature for 2 hours. A dark red solid was obtained after filtration, which was purified by Soxhlet extraction with methanol for 3 hours, hexane for 24 hours, and heptane for 24 hours. Then chlorobenzene was used to extract polymer for 24 hours. Removal of the solvent afforded 0.12 gram (46 percent yield) of poly(4,8-didodecyl-2,6-bis-(3-methyl-thiophen-2-yl)-benzo[1,2-b;4,5-b']dithiophene) (22) as a dark red solid. The molecular weight and distribution were measured by using high temperature GPC at 100° C., with $M_n$=16,550, $M_w$=65,300, and polydispersity: 3.95, against polystyrene standards.

2) Device Fabrication and Evaluation

There was selected a top-contact thin film transistor configuration as schematically illustrated, for example, in FIG. 3. The test device was comprised of an n-doped silicon wafer with a thermally grown silicon oxide layer of a thickness of about 200 nanometers thereon. The wafer functioned as the gate electrode while the silicon oxide layer acted as the gate dielectric; the silicon oxide layer had a capacitance of about 15 nF/cm$^2$ (nanofarads/square centimeter) as measured with a capacitor meter. The silicon wafer was first cleaned with isopropanol, argon plasma, isopropanol and air dried. Then the clean substrate was immersed in a 0.1 M solution of octyltrichlorosilane (OTS8) in toluene at 60° C. for 20 minutes. Subsequently, the wafer was washed with toluene, isopropanol and air-dried. Poly(4,8-didodecyl-2,6-bis-(3-methyl-thiophen-2-yl)-benzo[1,2-b;4,5-b']dithiophene) (22) dissolved in dichlorobenzene at a concentration of 0.5 percent by weight was used to deposit the semiconductor layer. The solution was first filtrated through a 1 micrometer syringe filter, and then spin-coated onto the OTS8-treated silicon substrate at 1,000 rpm for 120 seconds in a warm atmosphere resulting in thin film with a thickness of about 20 to about 50 nanometers. After being dried in vacuum oven at 70° C. for 5 to 10 hours, gold source and drain electrodes of about 50 nanometers in thickness for each were deposited on top of the semiconductor layer by vacuum deposition through a shadow mask with various channel lengths and widths, thus creating a series of transistors of various dimensions.

The evaluation of field-effect transistor devices performance was accomplished in a black box (that is, a closed box which excluded ambient light) at ambient conditions using a Keithley 4200 SCS semiconductor characterization system. The carrier mobility, μ, was calculated from the data in the saturated regime (gate voltage, $V_G$<source-drain voltage, $V_{SD}$) according to equation (1)

$$I_{SD}=C_i\mu(W/2L)(V_G-V_T)^2 \qquad (1)$$

where $I_{SD}$ is the drain current at the saturated regime, W and L are, respectively, the semiconductor channel width and length, $C_i$ is the capacitance per unit area of the gate dielectric layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}$=0.

Another property of field-effect transistor is its current on/off ratio. This is the ratio of the saturation source-drain current at the accumulation regime to the source-drain current at the depletion regime.

The transfer and output characteristics of the devices revealed that poly(4,8-didodecyl-2,6-bis-(3-methyl-thiophen-2-yl)-benzo[1,2-b:4,5-b']dithiophene) (22) is a p-type semiconductor. Using transistors with a dimension of W=5,000 μm and L=about 40 to about 90 μm, the following average properties from at least five transistors were obtained:

Mobility: about 0.08 to about 0.12 cm$^2$/V·s
Current on/off: about 2 to about 6×10$^6$

EXAMPLE II

1) Synthesis of poly(4,8-dihexyl-2,6-bis-(3-hexyl-thiophen-2-yl)-benzo[1,2-b:4,5-b']dithiophene) (23) (Scheme 1)

(a) Benzo[1,2-b:4,5-b']dithiophene-4,8-dione was prepared according to Beimling, P.; Koβmehl, G. *Chem. Ber.* Vol. 119, p. 3198 (1986), the disclosure of which is totally incorporated herein by reference)

(b) 4,8-Dihexynylbenzo[1,2-b:4,5-b']dithiophene

To a solution of hexyne (6.71 grams, 81.7 mmol) in THF (20 milliliters) in a 100 milliliter flask equipped with a condenser under an argon atmosphere were added dropwise 36 milliliters (72 mmol) of 2 M solution of isopropylmagnesium chloride in THF at room temperature. An exothermic reaction occurred upon addition. After addition, the reaction mixture was heated at 50° C. for 95 minutes and cooled down to room temperature. Benzo[1,2-b:4,5-b']dithiophene-4,8-dione (3 grams, 13.6 mmol) was added, and the mixture was heated at 50° C. for 1 hour before cooling down to room temperature. Subsequently, a solution of 20 grams of SnCl$_2$ in 50 milliliters 10 percent aq. HCl solution was added in a dropwise fashion followed by a further heating at 60° C. for 1 hour. After the reaction, the solvent was removed by vacuum evaporation, and the residue was purified by passing through a silica-gel flash column (eluent: hexane/dichloromethane, 2/1, v/v). Recrystallization of the crude product collected from flash chromatography from 2-propanol gave 3 grams (63 percent yield) of a red crystal after drying in vacuo.

¹H NMR (CDCl₃, 300 MHz, ppm): δ 7.59 (d, J=5.5 Hz, 2H), 7.51 (d, J=5.5 Hz, 2H), 2.66 (t, 4H), 1.74 (m, 4H), 1.64 (m, 4H), 1.03 (t, 6H).

¹³C NMR (CDCl₃, 300 MHz, ppm): δ 140.60, 138.63, 127.97, 123.64, 112.59, 100.75, 31.26, 22.43, 20.04, 14.08

(c) 4,8-Dihexylbenzo[1,2-b:4,5-b']dithiophene

To a solution of the above prepared 4,8-dihexynylbenzo[1,2-b:4,5-b']dithiophene (3 grams, 8.6 mmol) in THF (150 milliliters) in a round-bottomed flask was added 10 percent Pd/C (0.90 gram, 0.86 mmol). The mixture was stirred under a hydrogen atmosphere at room temperature for 24 hours. The solvent was removed by vacuum evaporation, and the residue with the catalyst impurity was purified by column chromatography on silica gel (eluent: hexane/dichloromethane, 2/1, v/v). Recrystallization of the product isolated from column chromatography from 20 milliliters of isopropanol in fridge afforded 1.54 grams (51 percent yield) of needle crystal after drying in vacuo.
(Caution: Hydrogen gas reacts with Pd/C violently, and may cause fire in the presence of oxygen)

¹H NMR (CDCl₃, 300 MHz, ppm): δ 7.49 (d, J=5.8 Hz, 2H), 7.47 (d, J=5.8 Hz, 2H), 3.20 (t, 4H), 1.82 (m, 4H), 1.48 (m, 8H), 1.35 (bs, 36H), 0.91 (t, 6H).

¹³C NMR (CDCl₃, 300 MHz, ppm): δ 137.73, 136.26, 129.39, 126.23, 122.25, 33.92, 30.11, 30.06, 30.03, 23.02, 14.51.

(d) 2,6-Dibromo-4,8-dihexylbenzo[1,2-b:4,5-b']dithiophene

To a well-stirred solution of the above prepared 4,8-dihexylbenzo[1,2-b:4,5-b']dithiophene 3 (1.54 grams, 4.29 mmol) in CH₂Cl₂ (30 milliliters) and acetic acid (7.5 milliliters) in a 200 milliliter 3-necked flask under an argon atmosphere was added powdered NBS (1.529 grams, 8.58 mmol) in small portions over a period of about 6 minutes in the absence of light. The resulting reaction mixture was stirred for 24 hours. After the reaction, the white precipitate formed was isolated by filtration, washed with water and methanol, and recrystallized from 40 milliliters acetone to provide 1.34 grams (60 percent yield) of green needle crystal after drying in vacuo.

¹H NMR (CDCl₃, 300 MHz, ppm): δ 7.43 (s, 2H), 3.00 (t, 4H), 1.75 (m, 4H), 1.44 (m, 4H), 1.35 (bs, 8H), 0.92 (t, 6H).

¹³C NMR (CDCl₃, 300 MHz, ppm): δ 139.04, 135.87, 127.99, 125.09, 115.29, 33.76, 32.04, 29.95, 29.87, 22.96, 14.46 e) 3-Hexylthiophene-2-boronic acid pinacol ester

A 100 milliliter three-necked round-bottomed flask was charged with magnetic stirrer, adding funnel and water condenser, and flushed with Argon and vacuumed three times at heating. Milligram turnings (0.83 gram, 34.0 mmol) were added into the flask and the system was flushed with Argon for 10 minutes before 10 milliliters of anhydrous ether were added. 2-bromo-3-hexyl-thiophene (7 grams, 28.3 mmol) with 20 milliliters anhydrous ether was added into the adding funnel. Around 5 milliliters of a thiophene solution were dropped slowly into the flask and heated the flask a little bit with heat gun. The reaction started three minutes late with continuous bubbling of ether, and the thiophene solution was dropped into the flask and the reaction was stirred at room temperature for another 2 hours. The Grignard solution was transferred to another 100 milliliter two-necked flask, and then cooled the solution to −78° C. A white precipitate formed when cooled and the solution became viscous. 2-Isopropoxy-4,4,5,5-tetramethyl-1,3,2-dioxaborolane (7 milliliters, 34 mmol) was added through syringe at −78° C. The precipitates were dissolved during the adding. Then the solution was warmed to room temperature and stirred for a further 18 hours. 15 Milliliters of water were added and the layers resulting were separated. The aqueous layer was extracted with CH₂Cl₂ (3×50 milliliters), and the combined organic fractions were dried (MgSO₄) and evaporated to dryness. Column chromatography on silica gel (eluent: hexane/dichloromethane, 4/1, v/v) enabled isolation of the 7 grams (yield 84 percent) of the above pure product e) as colorless liquid after dried in vacuo.

¹H NMR (CDCl₃, 300 MHz, ppm): δ 7.50 (d, J=5.1 Hz, 1H), 7.03 (d, J=5.1 Hz, 1H), 2.90 (t, 2H), 1.56 (m, 2H), 1.34 (bs, 18H), 0.91 (t, 3H).

¹³C NMR (CDCl₃, 300 MHz, ppm): δ 155.01, 131.68, 130.68, 83.84, 32.17, 32.07, 30.45 (×2), 29.44 (×2), 25.20 (×4), 23.04, 14.49.

f) 4,8-Dihexyl-2,6-bis-(3-hexyl-thiophen-2-yl)-benzo[1,2-b:4,5-b']dithiophene

To a 100 milliliter 3-necked reaction flask, 1.34 grams (2.59 mmol) of 2,6-dibromo-4,8-dihexylbenzo[1,2-b:4,5;b']dithiophene, 1.9 grams (6.48 mmol) of 3-hexylthiophene-2-boronic acid pinacol ester, and 50 milliliters of toluene were added. The resulting mixture was thoroughly stirred and was purged with argon. Then 0.06 gram of tetrakis(triphenylphosphine palladium(0)) (Pd(Ph₃P)₄), 0.64 gram of Aliquat in 5 milliliters of toluene, and 7.5 milliliters of 2 M aqueous Na₂CO₃ were added to the mixture. The reaction mixture obtained was stirred at 105° C. for 26 hours. After cooling to room temperature, about 23° C. to about 26° C., there were added 100 milliliters of toluene, and the resulting organic layer was washed with deionized water 3 times in a separatory funnel, dried over anhydrous MgSO₄, and filtered. After removing the solvent, the remaining solid was purified by column chromatography on silica gel (eluent: hexane/dichloromethane, 10/1.5, v/v) and recrystallized from 2-propanol to yield yellow needle-like crystals of f). Yield: 1.23 grams (49 percent).

¹H NMR (CDCl₃, 300 MHz, ppm): δ 7.44 (s, 2H), 7.28 (d, J=5 Hz, 2H), 7.01 (d, J=5 Hz, 2H), 3.17 (t, 4H), 2.91 (t, 4H), 1.86 (m, 4H), 1.73 (m, 4H), 1.36 (br, 24H), 0.91 (t, 12H).

¹³C NMR (CDCl₃, 300 MHz, ppm): δ 141.15, 137.99, 136.70, 136.14, 131.55, 130.59, 128.84, 125.06, 120.56, 33.80, 33.12, 32.09, 31.21, 30.07, 29.98, 29.87, 29.70, 23.02 (×2), 14.48, 14.45.

g) Poly(4,8-dihexyl-2,6-bis-(3-hexyl-thiophen-2-yl)-benzo[1,2-b:4,5-b']dithiophene) (23)

A solution of the above prepared 4,8-dihexyl-2,6-bis-(3-hexyl-thiophen-2-yl)-benzo[1,2-b:4,5-b']dithiophene (0.50 gram) in 5 milliliters of chlorobenzene was added drop-wise through a dropping funnel to a well-stirred mixture of FeCl₃ (iron(III)chloride) (0.59 gram) in 5 milliliters of chlorobenzene in a 50 milliliter round-bottom flask under an argon atmosphere over a period of 1 minute with droplet through the syringe. The green solution turned black immediately after added to the FeCl₃ solution. 10 Milliliters of chlorobenzene were used to clean the glassware. The resulting mixture was heated to 65° C. and maintained at this temperature for 48 hours under a blanket of argon. After cooling down to room temperature, 15 milliliters of chlorobenzene were added, and the solution was poured into 200 milliliters of methanol. The mixture was ultrasonicated for 20 minutes before stirred at room temperature for 1 hour. The polymer was filtered out and added into a well stirred mixture of 200 milliliters of methanol and 50 milliliters of ammonia aqueous solution (30 percent). The mixture was ultrasonicated for 5 minutes and then stirred at room temperature for 3 days. A dark red solid g) was obtained after filtration, which was purified by Soxhlet extraction with methanol for 4 hours, and heptane for 24 hours. Then chlorobenzene was used to extract polymer for 16 hours. Removal of solvent and drying in vacuo provided 60 milligrams (12 percent yield) of brown powder. The molecular weight and distribution were measured by using high temperature GPC at 100° C., with $M_n$=16,300, $M_w$=62,100, and polydispersity 3.81 against polystyrene standards.

2) Device Fabrication and Evaluation

There was selected a top-contact thin film transistor configuration as schematically illustrated, for example, in FIG. 3. The test device was comprised of an n-doped silicon wafer with a thermally grown silicon oxide layer of a thickness of about 200 nanometers thereon. The wafer functioned as the gate electrode while the silicon oxide layer acted as the gate dielectric; the silicon oxide layer had a capacitance of about 15 nF/cm² (nanofarads/square centimeter) as measured with a capacitor meter. The silicon wafer was first cleaned with isopropanol, argon plasma, isopropanol and air dried. Then the clean substrate were immersed in a 0.1 M solution of octyltrichlorosilane (OTS8) in toluene at 60° C. for 20 minutes. Subsequently, the wafer was washed with toluene, isopropanol, and air dried. Poly(4,8-dihexyl-2,6-bis-(3-hexyl-thiophen-2-yl)-benzo[1,2-b:4,5-b']dithiophene) (23) dissolved in dichlorobenzene at a concentration of 0.5 percent by weight was used to deposit the semiconductor layer. The solution was first filtrated through a 1 micrometer syringe filter, and then spin-coated onto the OTS8-treated silicon substrate at 1,000 rpm for 120 seconds in warm atmosphere, resulting in thin film with a thickness of about 20 to about 50 nanometers. After being dried in vacuum oven at 70° C. for 5 to 10 hours, gold source and drain electrodes of about 50 nanometers in thickness for each were deposited on top of the semiconductor layer by vacuum deposition through a shadow mask with various channel lengths and widths, thus creating a series of transistors of various dimensions.

The evaluation of field-effect thin film transistor performance was accomplished in a black box (that is, a closed box which excluded ambient light) at ambient conditions using a Keithley 4200 SCS semiconductor characterization system. The carrier mobility, μ, was calculated from the data in the saturated regime (gate voltage, $V_G$<source-drain voltage, $V_{SD}$) according to equation (1)

$$I_{SD}=C_i\mu(W/2L)(V_G-V_T)^2 \qquad (1)$$

where $I_{SD}$ was the drain current at the saturated regime, W and L were, respectively, the semiconductor channel width and length, $C_i$ was the capacitance per unit area of the gate dielectric layer, and $V_G$ and $V_T$ were, respectively, the gate voltage and threshold voltage. $V_T$ of the device was determined from the relationship between the square root of $I_{SD}$ at the saturated regime and $V_G$ of the device by extrapolating the measured data to $I_{SD}$=0.

Another property of field-effect transistor was its current on/off ratio. This was the ratio of the saturation source-drain current at the accumulation regime to the source-drain current at the depletion regime.

The transfer and output characteristics of the devices revealed that poly(4,8-dihexyl-2,6-bis-(3-hexyl-thiophen-2-yl)-benzo[1,2-b:4,5-b']dithiophene) (23) was a p-type semiconductor. Using transistors with a dimension of W=5,000 μm and L=about 40 to about 90 μm, the following average properties from at least five transistors were obtained Mobility: about 0.14 to about 0.20 cm²/V·s
Current on/off: about 10⁴ to about 10⁶

Thus, thin film transistor of poly(dithienylbenzo[1,2-b:4,5-b']dithiophene)s encompassed by Formulas/Structures (I) was excellent semiconductors for electronic devices. As a channel semiconductor in thin film transistors, they demonstrated high field effect mobility and high current on/off ratio. In addition, the device fabrication and characterization were accomplished in ambient conditions, evidencing their oxidative stability for a number of weeks as compared to regioregular poly(3-alkylthiophene)s devices which were stable for about less than one week.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others. Unless specifically recited in a claim, steps or components of claims should not be implied or imported from the specification or any other claims as to any particular order, number, position, size, shape, angle, color, or material.

What is claimed is:

1. A semiconductor homopolymer, wherein the semiconductor homopolymer is a poly(dithienylbenzo[1,2-b:4,5-b']dithiophene) of Formula (14), (15), (16), or (17):

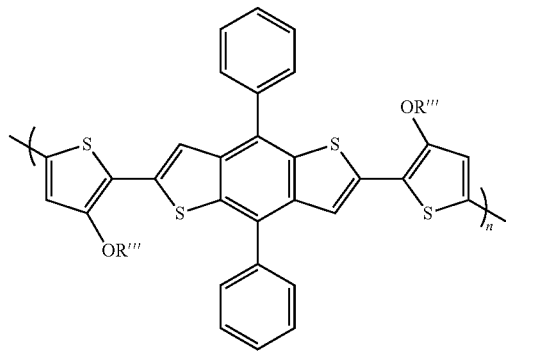

(14)

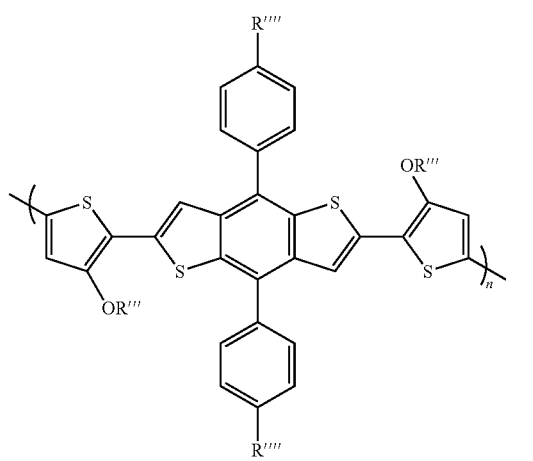

(15)

(16)

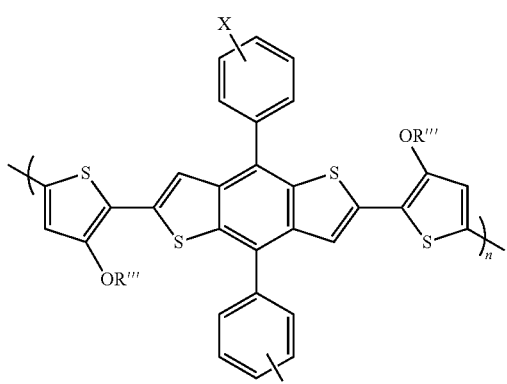

(17)

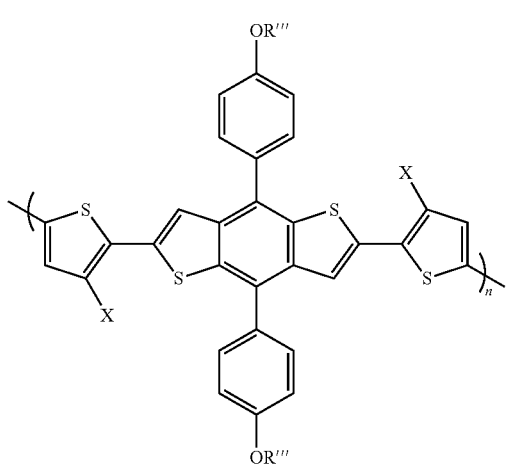

wherein each R''' independently represents alkyl or substituted alkyl having from about 1 to about 35 carbon atoms; X represents F, Cl, Br, CN, or $NO_2$; and n is from about 2 to about 5,000.

2. An electronic device comprising the semiconductor homopolymer of claim 1.

3. A semiconductor homopolymer of Formula (31), (32), or (33):

(31)

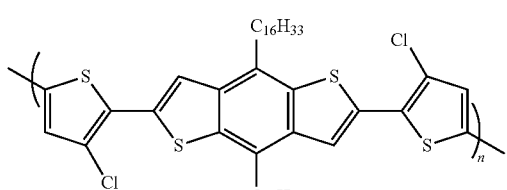

(32)

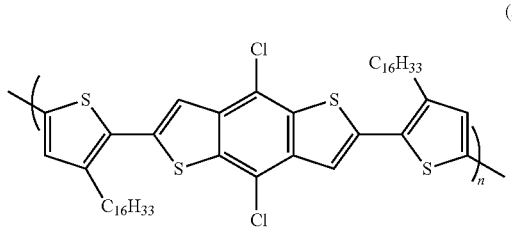

(33)

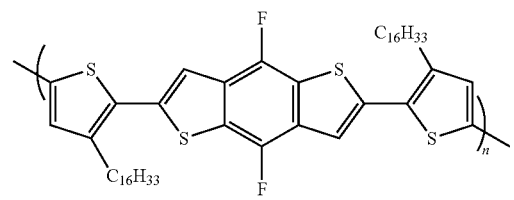

wherein the semiconductor homopolymer has a number average molecular weight ($M_n$) of from about 500 to about 400,000 and a weight average molecular weight ($M_w$) of from about 600 to about 500,000.

4. An electronic device comprising the semiconductor homopolymer of claim 3.

5. A semiconductor homopolymer of Formula (5), (6), (7), (8), (18), or (20):

(5)

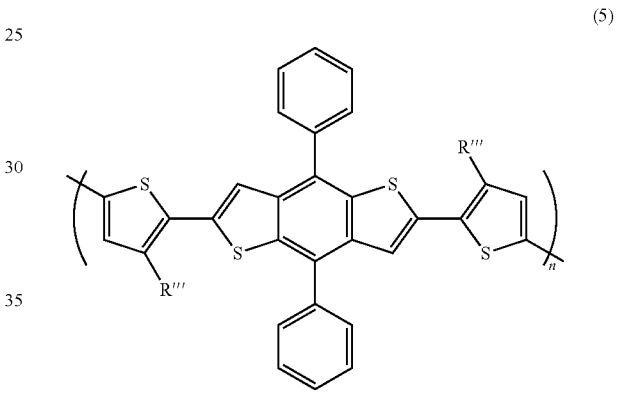

(6)

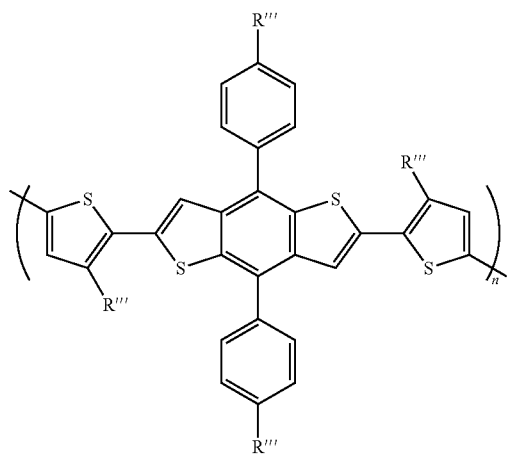

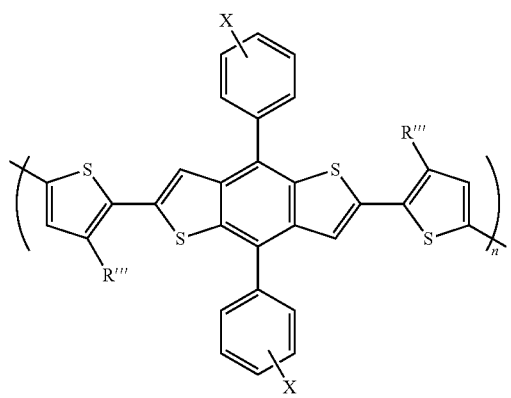
(7)
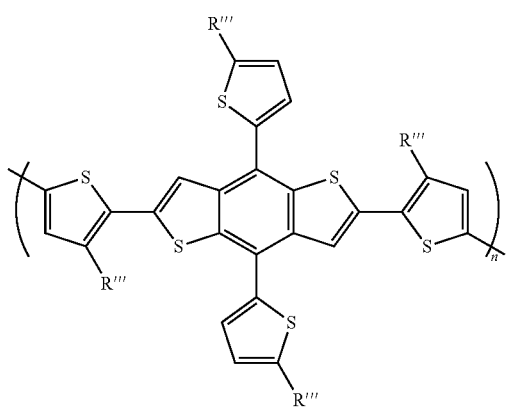
(18)
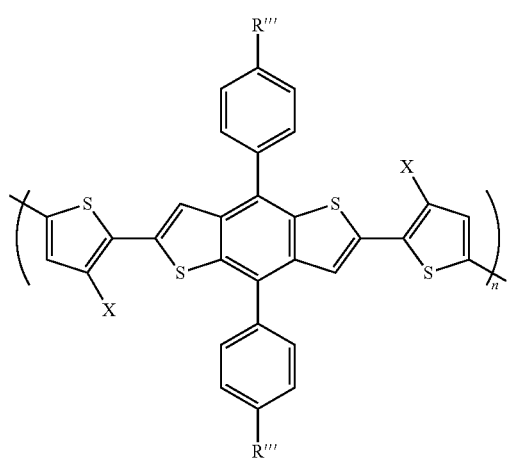
(8)
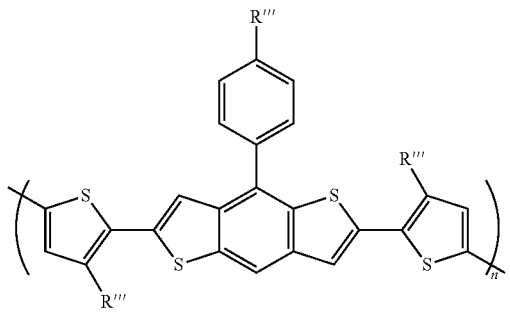
(20)
wherein each R''' and R'''' independently represents alkyl or substituted alkyl having from about 1 to about 35 carbon atoms; X represents F, Cl, Br, CN, or $NO_2$; and n is from about 2 to about 5,000.
6. An electronic device comprising the semiconductor homopolymer of claim 5.
* * * * *